United States Patent
Kang et al.

(10) Patent No.: US 9,157,004 B2
(45) Date of Patent: Oct. 13, 2015

(54) COMPOSITION FOR FORMING COPPER PATTERN AND METHOD FOR FORMING COPPER PATTERN

(71) Applicants: NOF CORPORATION, Tokyo (JP); OSAKA UNIVERSITY, Suita-shi, Osaka (JP)

(72) Inventors: Eui-chul Kang, Tsukuba (JP); Tomoyuki Ohtake, Tsukuba (JP); Katsuaki Suganuma, Suita (JP); Masaya Nogi, Suita (JP); Natsuki Komoda, Suita (JP)

(73) Assignees: NOF CORPORATION, Tokyo (JP); OSAKA UNIVERSITY, Osaka (JP)

( * ) Notice: Subject to any disclaimer, the term of this patent is extended or adjusted under 35 U.S.C. 154(b) by 0 days.

(21) Appl. No.: 14/358,164

(22) PCT Filed: Oct. 23, 2012

(86) PCT No.: PCT/JP2012/077372
§ 371 (c)(1),
(2) Date: May 14, 2014

(87) PCT Pub. No.: WO2013/073349
PCT Pub. Date: May 23, 2013

(65) Prior Publication Data
US 2014/0305684 A1    Oct. 16, 2014

(30) Foreign Application Priority Data
Nov. 15, 2011    (JP) ................................. 2011-249949

(51) Int. Cl.
| | | |
|---|---|---|
| C09K 13/06 | (2006.01) | |
| C09D 11/52 | (2014.01) | |
| C23C 18/08 | (2006.01) | |
| H01B 1/22 | (2006.01) | |
| C09D 11/30 | (2014.01) | |
| C23C 18/06 | (2006.01) | |
| H05K 1/09 | (2006.01) | |
| H05K 3/12 | (2006.01) | |

(52) U.S. Cl.
CPC ................ C09D 11/52 (2013.01); C09D 11/30 (2013.01); C23C 18/06 (2013.01); C23C 18/08 (2013.01); H01B 1/22 (2013.01); H05K 1/097 (2013.01); H05K 3/1283 (2013.01); *H05K 2203/121* (2013.01)

(58) Field of Classification Search
CPC ........ C09D 11/52; C09D 11/54; C09D 11/03; C23C 18/08; H01L 21/027
USPC ........ 252/79.1, 79.2, 79.3, 79.4, 512; 216/40, 216/56; 430/308, 309
See application file for complete search history.

(56) References Cited

U.S. PATENT DOCUMENTS

| | | | |
|---|---|---|---|
| 7,591,872 | B1 | 9/2009 | Jun et al. |
| 2008/0159902 | A1* | 7/2008 | Shim et al. ................... 420/469 |
| 2009/0029148 | A1* | 1/2009 | Hashimoto et al. ........... 428/323 |
| 2009/0223410 | A1* | 9/2009 | Jun et al. ..................... 106/31.92 |
| 2009/0308645 | A1* | 12/2009 | Lee et al. ....................... 174/257 |
| 2010/0051329 | A1* | 3/2010 | Kim et al. ..................... 174/255 |

FOREIGN PATENT DOCUMENTS

| | | |
|---|---|---|
| JP | 2007-46162 A | 2/2007 |
| JP | 2007-321215 A | 12/2007 |
| JP | 2008-13466 A | 1/2008 |
| JP | 2008-159535 A | 7/2008 |
| JP | 2009-197133 A | 9/2009 |
| JP | 201134750 A | 2/2011 |

OTHER PUBLICATIONS

Byoungyoon Lee et al., "A low-cure-temperature copper nano ink for highly conductive printed electrodes", Currently Applied Physics, 2009, pp. e157-e160, vol. 9.

Young-In Lee et al., "Effect of Complex Agent on Characteristics of Copper Conductive Pattern Formed by Ink-jet Printing", Japanese Journal of Applied Physics, 2010, pp. 086501-1-086501-4, vol. 49.

(Continued)

*Primary Examiner* — Lan Vinh
(74) *Attorney, Agent, or Firm* — Sughrue Mion, PLLC

(57) ABSTRACT

A composition for copper patterning and a method of copper patterning using the composition are provided, which composition is excellently safe in copper patterning, sintering at lower temperatures, and capable of forming a highly conducive copper pattern of a desired shape even on a plastic substrate. The composition contains Component A: a copper β-ketocarboxylate compound of formula (1):

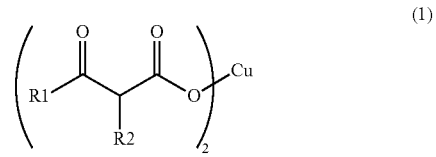

(1)

(R1, R2: H or C1-C6 straight- or C3-C6 branched-hydrocarbon group, etc.); and based on 1 mol of this compound, Component B: an amine compound having a boiling point of not higher than 250° C. at 0.1 to 500 mol; and Component C-1: an organic acid having pKa of not more than 4 at 0.01 to 20 mol, and/or Component C-2: an organic copper compound composed of copper and an organic acid having pKa of not more than 4 at 0.01 to 100 mol. The composition is useful in the field of electronics.

4 Claims, No Drawings

(56) References Cited

OTHER PUBLICATIONS

Akihiro Yabuki et al., "Low-Temperature synthesis of copper conductive film by thermal decomposition of copper-amine complexes", Thin Solid Films, 2011, pp. 6530-6533, vol. 519.

Chun Zhang et al., "Dioxygen Activation under Ambient Conditions: Cu-Catalyzed Oxidative Amidation-Diketonization of Terminal Alkynes Leading to α-Ketoamides", J. Am. Chem. Soc., 2010, pp. 28-29, vol. 132.

D. P. Graddon, "The Absorption Spectra of Complex Salts-III Cupric Ethylacetoacetate", J. Inorg. Nucl. Chem., 1960, pp. 161-168, vol. 14.

International Searching Authority, International Preliminary Report on Patentability dated May 20, 2014 in counterpart International Application No. PCT/JP2012/077372.

European Patent Office, Communication dated Apr. 28, 2015, issued in counterpart Application No. 12849159.4.

XP-002738122, Copper Salt Compositions, their manufacture, and cost-effective formation of electrically conductive films from them.

Yabuki et al, Low Temperature synthesis of copper conductive film by thermal decomposition of copper amine complexes, Thin Solid Films, Elsevier Sequoia S.A. Lausanne, CH, vol. 519, No. 19, Apr. 18, 2011, pp. 6530-6533, XP028377883.

* cited by examiner

COMPOSITION FOR FORMING COPPER PATTERN AND METHOD FOR FORMING COPPER PATTERN

CROSS REFERENCE TO RELATED APPLICATIONS

This application is a National Stage of International Application No. PCT/JP2012/077372 filed Oct. 23, 2012, claiming priority based on Japanese Patent Application No. 2011-249949 filed Nov. 15, 2011, the contents of all of which are incorporated herein by reference in their entirety.

FIELD OF ART

The present invention relates to a compound for copper patterning useful in the fields of electronics and the like, as well as copper patterns formed with the same and a method of producing the same.

BACKGROUND ART

Techniques have recently been attracting attention for printing, such as ink jet or screen printing, with a metallic ink on a flexible plastic substrate, followed by sintering, to form desired conductive patterns. The metallic ink used here is desired to sinter at lower temperatures below the heat resistance temperature of the plastic substrate. As such metallic inks for conductive patterning, silver- or copper-containing inks that are sintering at lower temperatures have widely been developed. Among them, copper has advantages over silver for its more excellent electrical characteristics and lower price.

As the inks for copper patterning, there are known inks in which copper carboxylate is used as the copper material (Non-patent Publications 1 and 2) and in which copper fine particles are dispersed (Patent Publications 1 and 2). Since copper is prone to oxidation, sintering of such inks is often performed in a reducing atmosphere, such as of hydrogen or formic acid, which causes safety problems in industrialization. In addition, the sintering temperature is as high as 250° C. or higher, and thus can be applied to only some types of plastic substrates.

In order to solve these problems, there are proposed inks achieving low-temperature sintering, such as the one disclosed in Non-patent Publication 3, which is composed of copper formate, amine, and a solvent. This ink is made into a copper pattern by sintering at 120 to 160° C. in nitrogen atmosphere. However, sintering of such conventional copper ink which contains an organic copper compound or copper fine particles as a copper material may result in shrinkage of the printed film, and the sintered pattern may be different from the desired, as-printed pattern.

On the other hand, it has been reported that materials containing organic components, which decompose and vaporize at lower temperatures, are useful in inks such as those on plastic substrates, which need to be sintered at lower temperatures. As such compounds, silver β-ketocarboxylate compounds are known, which are reported to be capable of silver patterning at lower temperatures (Patent Publication 3).

As a corresponding copper compound exhibiting similar decomposition mechanism, a copper β-ketocarboxylate compound may be envisaged. Copper β-ketocarboxylate compounds have been studied over a long time, and used as a polymerization catalyst or a silver reducing agent (Patent Publication 4, Non-patent Publications 4 and 5).

However, these compounds have never been used as a material for copper patterning, partly because copper is more prone to oxidation than silver, and conductive copper patterns cannot be obtained by techniques similar to those for the silver β-ketocarboxylate compounds.

Patent Publication 1: JP-2007-321215-A
Patent Publication 2: JP-2008-13466-A
Patent Publication 3: JP-2009-197133-A
Patent Publication 4: JP-2007-46162-A
Non-patent Publication 1: Current Applied Physics, 9, 2009, 157
Non-patent Publication 2: Jpn. J. Appl. Phys., 49, 2010, 86501
Non-patent Publication 3: Thin Solid Films, 519, 2011, 6530
Non-patent Publication 4: Journal of Inorganic and Nuclear Chemistry, 14, 1960, 161
Non-patent Publication 5: J. Am. Chem. Soc., 132(1), 2010, 28

SUMMARY OF THE INVENTION

It is an object of the present invention to provide a composition for copper patterning which is excellently safe in copper patterning, sintering at lower temperatures, and capable of forming a highly conductive copper pattern of a desired shape even on a plastic substrate.

It is another object of the present invention to provide a method of copper patterning that produces with excellent safety a copper pattern of a desired shape with high conductivity by low-temperature sintering at a good yield even on a plastic substrate.

It is yet another object of the present invention to provide a copper pattern having a desired shape and a high conductivity.

According to the present invention, there is provided a composition for copper patterning comprising:

Component A: a copper β-ketocarboxylate compound represented by the formula (1):

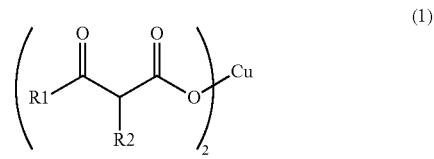

wherein R1 and R2 each independently stands for a hydrogen atom or a C1-C6 straight- or C3-C6 branched-chain hydrocarbon group, or R1 and R2 are linked with a C2-C4 hydrocarbon group; and based on 1 mol said compound, Component B: an amine compound having a boiling point of not higher than 250° C. at 0.1 to 500 mol; and at least one of:

Component C-1: an organic acid having pKa of not more than 4 at 0.01 to 20 mol, and Component C-2: an organic copper compound composed of copper and an organic acid having pKa of not more than 4 at 0.01 to 100 mol.

According to the present invention, there is also provided a method of copper patterning comprising printing with the above-mentioned composition for copper patterning on a substrate, and sintering at 120 to 250° C. in an inert gas atmosphere.

According to the present invention, there is further provided a copper pattern obtained by the above-mentioned method.

The composition for copper patterning according to the present invention, containing the above-mentioned components at the particular ratio, is excellently safe in copper patterning, sintering at lower temperatures, and capable of forming a highly conductive copper pattern of a desired shape even on a plastic substrate of which heat resistance temperature is low. Thus, the copper pattern formed of the composition of the present invention is useful in wide fields of electronics, including semiconductor-related applications, such as circuit boards and transistors, FPDs (flat panel displays), such as organic EL, and solar cells.

PREFERRED EMBODIMENTS OF THE INVENTION

The present invention will now be explained in more detail.
[Component A]

The composition for copper patterning according to the present invention contains Component A, a copper β-ketocarboxylate compound represented by the above-mentioned formula (1).

In the formula (1), R1 and R2 each independently stands for a hydrogen atom or a C1-C6 straight- or C3-C6 branched-chain hydrocarbon group, or R1 and R2 are linked with a C2-C4 hydrocarbon group.

The C1-C6 hydrocarbon group may specifically be a methyl, ethyl, propyl, isopropyl, butyl, tert-butyl, isobutyl, sec-butyl, pentyl, isopentyl, cyclopentyl, hexyl, cyclohexyl, or phenyl group. The linking C2-C4 hydrocarbon group, such as a propylene or butylene group, forms a cyclic structure. R1 and R2 are preferably a combination of a methyl group and a hydrogen atom, a combination of a methyl group and a methyl group, or a combination of a propyl group and a hydrogen atom, in view of the availability of the raw materials.

Examples of Component A may include copper (II) acetoacetate, copper (II) 2-methylacetoacetate, copper (II) propionylacetate, copper (II) isopropylacetate, copper (II) 2-ethylacetoacetate, copper (II) butyrylacetate, copper (II) isobutyrylacetate, copper (II) pivaloylacetate, and copper (II) cyclohexanone-2-acetate; anhydrides thereof; hydrates thereof; and mixtures thereof. In view of the availability of the raw materials, copper (II) acetoacetate, copper (II) 2-methylacetoacetate, or copper (II) butyrylacetate; anhydrides thereof; hydrates thereof; or mixtures thereof are preferred, and in view of easy synthesis dihydrates thereof are preferred.
[Component B]

The composition for copper patterning according to the present invention contains Component B, an amine compound having a boiling point of not higher than 250° C.

Examples of Component B may include primary, secondary, and tertiary amines having a boiling point of not higher than 250° C. In view of the solubility of copper materials therein, primary amines are preferred.

Examples of the primary amines having a boiling point of not higher than 250° C. may include n-butylamine, sec-butylamine, tert-butylamine, amylamine, isoamylamine, hexylamine, heptylamine, octylamine, 2-ethylhexylamine, 2-amino alcohol, ethylenediamine, 1,2-diaminopropane, 1,3-diaminopropane, 1,3-diaminopentane, 2-ethoxyethylamine, 2-methoxyethylamine, and 3-ethoxypropylamine. In view of the solubility of copper materials therein, n-butylamine or amylamine, which has a low molecular weight, or isoamylamine or 2-ethylhexylamine, which has a branched structure, is preferred.

The amine compound of Component B may be of a single kind or a mixture of two or more kinds. In view of the printability or sintering of the resulting ink, a mixture of two or more kinds is preferred.

The compound for copper patterning according to the present invention contains Component C-1, an organic acid having pKa of not more than 4 and/or Component C-2, an organic copper compound composed of copper and an organic acid having pKa of not more than 4.
[Component C-1]

Examples of Component C-1 may include formic acid (pKa=3.75), oxalic acid (pKa=1.27), glyoxylic acid (pKa=2.98), and pyruvic acid (pKa=2.49). One or a mixture of two or more of these may be used. In view of the volatility upon sintering, formic acid is preferred.
[Component C-2]

Examples of Component C-2 may include copper formate, copper oxalate, copper glyoxylate, and copper pyruvate; anhydrides thereof; hydrates thereof; and mixtures thereof. In view of the availability of the raw materials and volatility of the organic acid component upon sintering, copper formate anhydride or copper formate tetrahydrate are preferably used.

In the composition for copper patterning according to the present invention, the content of each component is, based on 1 mol of Component A, 0.1 to 500 mol, preferably 0.5 to 400 mol, most preferably 1 to 300 mol of Component B. At less than 0.1 mol of Component B, Components A and C-2 may precipitate. At over 500 mol of Component B, the copper content of the composition for copper patterning may be low to cause discontinuity and defect of sintered copper pattern.

The content of Component C-1, when contained, based on 1 mol of Component A, is 0.01 to 20 mol, preferably 0.05 to 10 mol, most preferably 0.1 to 5 mol. At less than 0.01 mol of Component C-1, oxidation due to decomposition products of Component A may proceed during sintering to increase the volume resistivity of the resulting pattern. At over 20 mol of Component C-1, volume shrinkage may occur during sintering to cause failure to achieve the desired pattern.

The content of Component C-2, when contained, based on 1 mol of Component A, is 0.01 to 100 mol, preferably 0.05 to 80 mol, most preferably 0.1 to 50 mol. At less than 0.01 mol of Component C-2, oxidation due to decomposition products of Component A may proceed during sintering to increase the volume resistivity of the resulting pattern. At over 100 mol of Component C-2, volume shrinkage may occur during sintering to cause failure to achieve the desired pattern.

When neither Component C-1 nor C-2 is contained, oxidation due to decomposition products of Component A may proceed during sintering to increase the volume resistivity of the resulting pattern.

The composition for copper patterning according to the present invention may optionally contain other raw copper materials, solvents, or known additives as needed, as long as the effects of the present invention are not impaired.

In order to improve the copper concentration of the composition for copper patterning, copper fine particles having a particle size of 3 nm to 500 nm, or copper filler having a particle size on the order of micrometers may be added as the other raw copper materials. In view of conductivity, addition of the copper fine particles is preferred and if added, at a preferred ratio of 0.001 to 10 parts by mass with respect to 1 part by mass of Component A.

In order to improve printability of the composition for copper patterning, solvents and additives for adjusting concentration, surface tension, viscosity, or vaporization rate may be added.

Such solvents are not particularly limited as long as they do not react with the other components, and may be, for example, alcohol solvents, such as methanol, ethanol, n-propyl alcohol, isopropyl alcohol, n-butyl alcohol, isobutyl alcohol, sec-butyl alcohol, pentanol, hexanol, cyclohexanol, benzyl alcohol, or terpineol; glycol solvents, such as ethylene glycol, propylene glycol, butylene glycol, pentanediol, diethylene glycol, or dipropylene glycol; or ether solvents, such as propylene glycol monomethyl ether, diethylene glycol dimethyl ether, diethylene glycol diethyl ether, triethylene glycol dimethyl ether, triethylene glycol diethyl ether, tetrahydrofuran, or 1,4-dioxane. The ratio of the solvents, when added, is preferably 0.01 to 100 parts by mass with respect to 1 part by mass of Component A.

The additives may include, for example, leveling agents, coupling agents, viscosity adjusting agents, and antioxidants. The ratio of the additives, when added, is preferably 0.001 to 10 parts by mass with respect to 1 part by mass of Component A.

The copper pattern according to the present invention may be obtained by, for example, a method of the present invention including printing with the composition for copper patterning of the present invention on a substrate, and sintering at 120 to 250° C. in an inert gas atmosphere.

The copper pattern according to the present invention is a pattern printed by various printing process into an arbitrary shape, which may be selected depending on applications. For example, solid pattern, line pattern, hole pattern, or dot pattern may be employed. The printing process may be conventional, such as screen printing, roll coating, air-knife coating, blade coating, bar coating, gravure coating, die coating, slide coating, or ink jet coating.

The substrate on which the printing with the composition for copper patterning of the present invention is to be done may be, for example, a plastic substrate such as those made of polyimide, polyester, epoxy resin, bismaleimide-triazine resin, modified polyphenylene ether, ABS resin, polyamide, polyethylene, polyvinyl chloride, or a fluororesin; a glass substrate such as those made of soda glass, borosilicate glass, silica glass, or quartz glass; or a wired substrate having metallic traces such as those made of gold, silver, copper, or aluminum. The substrate may have been treated with primer or plasma, or by etching, for improving adhesion.

The inert gas used in the sintering may be, for example, helium, nitrogen, or argon gas. The sintering temperature may vary according to the kind of the substrate, and may be at any temperature as long as it is not higher than the heat resistance temperature of the substrate and not lower than the temperature at which the organic components in the composition for copper patterning of the present invention vaporizes, and is usually 120 to 250° C.

At a sintering temperature of lower than 120° C., the organic components in the composition for copper patterning remains in the resulting copper pattern, which may cause increase in the volume resistivity. At a sintering temperature over 250° C., the heat resistance temperature of some substrate may be exceeded, so that the sintering cannot be carried out.

The duration of sintering, which depends on the sintering temperature, may be of any length as long as the organic components in the composition for copper patterning of the present invention vaporize sufficiently, and is usually 1 to 120 minutes, preferably 3 to 60 minutes.

The copper pattern produced in accordance with the present invention may be in any desired pattern formed by various printing process, and may be formed into a conductive body having a volume resistivity of not higher than $1 \times 10^3$ μΩ·cm. Such copper pattern is useful in the field of electronics.

EXAMPLES

The present invention will now be explained in more detail with reference to the examples, which are not intended to limit the present invention.

Synthesis Example 1

Synthesis of Copper (II) Acetoacetate Dihydrate (in Formula (1), R1 is a Methyl Group and R2 is a Hydrogen Atom)

Into a NaOH aqueous solution (2.30 g, 24.0 mL) for hydrolysis, 6.24 g (48.0 mmol) of ethyl acetoacetate was added, and stirred under heating at 30° C. for 3 hours. After the three hours, the reaction mixture was cooled down to 0° C., and a 5 N $HNO_3$ aqueous solution was added thereto to make the reaction liquid acidic. To the reaction mixture, 2.90 g (4.80 mmol) of a copper (II) nitrate aqueous solution was added dropwise, and subjected to magnetic stirring for 4 hours. The precipitated solid was taken out by filtration, and washed with ion-exchanged water and acetone to obtain 2.05 g (6.70 mmol) of copper (II) acetoacetate dihydrate in the form of light blue solid.

Synthesis Example 2

Synthesis of Copper (II) Butyrylacetate Dihydrate (in Formula (1), R1 is a Propyl Group and R2 is a Hydrogen Atom)

Into a NaOH aqueous solution (3.46 g, 24.0 mL) for hydrolysis, 11.4 g (72.0 mmol) of ethyl butyrylacetate was added, and stirred under heating at 30° C. for 3 hours. After the three hours, the reaction mixture was cooled down to 0° C., and a 5 N $HNO_3$ aqueous solution as added thereto to make the reaction liquid acidic. To the reaction mixture, 4.34 g (7.20 mmol) of a copper (II) nitrate aqueous solution was added dropwise, and subjected to magnetic stirring for 3 hours. The precipitated solid was taken out by filtration, and washed with ion-exchanged water and acetone to obtain 4.37 g (12.2 mmol) of copper (II) butyrylacetate dihydrate in the form of blue solid.

Synthesis Example 3

Synthesis of Copper (II) 2-Methylacetoacetate Dihydrate (in formula (1), R1 is a methyl group and R2 is a methyl group)

Into a NaOH aqueous solution (3.46 g, 24.0 mL) for hydrolysis, 10.4 g (72.0 mmol) of ethyl 2-methylacetoacetate was added, and stirred under heating at 30° C. for 3 hours. After the three hours, the reaction mixture was cooled down to 0° C., and a 5 N $HNO_3$ aqueous solution was added thereto to make the reaction liquid acidic. To the reaction mixture, 4.34 g (7.20 mmol) of copper (II) nitrate aqueous solution was added dropwise, and subjected to magnetic stirring for 3 hours. The precipitated solid was taken out by filtration, and washed with ion-exchanged water and acetone to obtain 2.81 g (8.52 mmol) of copper (II) 2-methylacetoacetate dihydrate in the form of blue solid.

Examples 1-1 to 1-30

Preparation of Composition for Copper Patterning

Compositions for copper patterning were prepared at the compositional ratios shown in Table 1. As the copper fine particles indicated in the table, copper fine particles manufactured by NISSHIN ENGINEERING INC. ($D_{BET}$=81.0 nm; surface oxide film: about 2 nm) were used. In the table, SFCP-200A, SFCP-10AX, and SFCP-500A refer to copper fine particles under the trade names SFCP-200A ($D_{BET}$=126 nm, without dispersant), SFCP-10AX ($D_{BET}$=48.2 nm, with dispersant) and SFCP-500A ($D_{BET}$=545 nm, without dispersant), respectively, all manufactured by FUKUDA METAL FOIL & POWDER CO., LTD. In Example 1-30, two kinds of copper fine particles were mixed in use. $D_{BET}$ indicates the particle size calculated by the BET method.

TABLE 1

| | Component A: Copper β-ketocarboxylate compound | | | Component B: Amine compound (g) | | | | | | |
|---|---|---|---|---|---|---|---|---|---|---|
| | Compound used | Mass (g) | In mole (mmol) | 2-Ethyl-hexyl amine (b.p. 168° C.) | n-Butyl amine (b.p. 77° C.) | n-Hexyl amine (b.p. 130° C.) | Isoamyl amine (b.p. 97° C.) | 3-Ethoxy-propyl amine (b.p. 132° C.) | n-Amyl amine (b.p. 104° C.) | 3-Amino-1,2-propane diol (b.p. >250° C.) |
| Ex.1-1 | Copper acetoacetate dihydrate | 0.3 | 1.0 | 0.25 | 0.25 | — | — | — | — | — |
| Ex. 1-2 | Copper acetoacetate dihydrate | 0.30 | 1.0 | 2.5 | 2.5 | — | — | — | — | — |
| Ex. 1-3 | Copper acetoacetate dihydrate | 0.30 | 1.0 | 2.5 | 2.5 | — | — | — | — | — |
| Ex. 1-4 | Copper acetoacetate dihydrate | 0.30 | 1.0 | 0.25 | 0.25 | — | — | — | — | — |
| Ex. 1-5 | Copper acetoacetate dihydrate | 0.30 | 1.0 | 2.5 | 2.5 | — | — | — | — | — |
| Ex. 1-6 | Copper acetoacetate dihydrate | 0.30 | 1.0 | 2.5 | 2.5 | — | — | — | — | — |
| Ex. 1-7 | Copper butyrylacetate dihydrate | 0.36 | 1.0 | 2.5 | 2.5 | — | — | — | — | — |
| Ex. 1-8 | Copper 2-methyl-acetoacetate dihydrate | 0.33 | 1.0 | 2.5 | 2.5 | — | — | — | — | — |
| Ex. 1-9 | Copper acetoacetate dihydrate | 0.30 | 1.0 | 2.0 | 2.0 | — | — | — | — | — |
| Ex. 1-10 | Copper acetoacetate dihydrate | 0.30 | 1.0 | 9.0 | 9.0 | — | — | — | — | — |
| Ex. 1-11 | Copper acetoacetate dihydrate | 0.30 | 1.0 | 5.0 | 5.0 | — | — | — | — | — |
| Ex. 1-12 | Copper acetoacetate dihydrate | 0.30 | 1.0 | 2.5 | — | — | 2.5 | — | — | — |
| Ex. 1-13 | Copper acetoacetate dihydrate | 0.30 | 1.0 | 5.0 | — | — | — | — | — | — |
| Ex. 1-14 | Copper acetoacetate dihydrate | 0.30 | 1.0 | — | — | 5.0 | — | — | — | — |
| Ex. 1-15 | Copper acetoacetate dihydrate | 0.30 | 1.0 | — | — | — | — | 5.0 | — | — |
| Ex. 1-16 | Copper acetoacetate dihydrate | 0.30 | 1.0 | 2.5 | 2.5 | — | — | — | — | — |
| Ex. 1-17 | Copper acetoaceate dihydrate | 0.30 | 1.0 | 2.4 | 2.4 | — | — | — | — | — |
| Ex. 1-18 | Copper acetoaceate dihydrate | 0.30 | 1.0 | 2.4 | 2.4 | — | — | — | — | — |
| Ex. 1-19 | Copper acetoaceate dihydrate | 0.30 | 1.0 | 2.4 | 2.4 | — | — | — | — | — |

TABLE 1-continued

| | | | | | | | | | | |
|---|---|---|---|---|---|---|---|---|---|---|
| Ex. 1-20 | Copper acetoaceate dihydrate | 0.30 | 1.0 | 2.4 | 2.4 | — | — | — | — | — |
| Ex. 1-21 | Copper acetoaceate dihydrate | 0.30 | 1.0 | 2.4 | 2.4 | — | — | — | — | — |
| Ex. 1-22 | Copper acetoaceate dihydrate | 0.30 | 1.0 | 0.25 | 0.25 | — | — | — | — | — |
| Ex. 1-23 | Copper acetoaceate dihydrate | 0.30 | 1.0 | 2.5 | 1.1 | — | — | — | — | — |
| Ex. 1-24 | Copper acetoaceate dihydrate | 0.30 | 1.0 | 3.7 | — | — | — | — | 1.7 | — |
| Ex. 1-25 | Copper acetoaceate dihydrate | 0.30 | 1.0 | 3.7 | — | — | — | — | 1.7 | — |
| Ex. 1-26 | Copper acetoaceate dihydrate | 0.30 | 1.0 | 3.7 | — | — | — | — | 1.7 | — |
| Ex. 1-27 | Copper acetoaceate dihydrate | 0.30 | 1.0 | 3.7 | — | — | — | — | 1.7 | — |
| Ex. 1-28 | Copper acetoaceate dihydrate | 0.30 | 1.0 | 3.7 | — | — | — | — | 1.7 | — |
| Ex. 1-29 | Copper acetoaceate dihydrate | 0.30 | 1.0 | 3.7 | — | — | — | — | 1.7 | — |
| Ex. 1-30 | Copper acetoaceate dihydrate | 0.30 | 1.0 | 3.7 | — | — | — | — | 1.7 | — |

| | Component B: Amine compound (g) | Component C-1: Organic acid | | | Component C-2: Organic Copper compound | | | Other component | |
|---|---|---|---|---|---|---|---|---|---|
| | In mole (mmol) | Compound used | Mass (g) | In mole (mmol) | Compound used | Mass (g) | In mole (mmol) | Compound used | Mass (g) |
| Ex.1-1 | 5.4 | Formic acid | 0.083 | 1.8 | — | — | — | — | — |
| Ex. 1-2 | 54 | Glyoxyl acid | 0.014 | 0.19 | Copper (II) formate tetrahydrate | 2.0 | 9.0 | — | — |
| Ex. 1-3 | 54 | Oxalic acid | 0.014 | 0.16 | Copper (II) formate tetrahydrate | 2.0 | 9.0 | — | — |
| Ex. 1-4 | 5.4 | Formic acid | 0.074 | 1.6 | Copper (II) glyoxylate dihydrate | 0.035 | 0.20 | — | — |
| Ex. 1-5 | 54 | — | — | — | Copper (II) formate tetrahydrate | 2.3 | 9.0 | — | — |
| Ex. 1-6 | 54 | — | — | — | Copper (II) formate | 1.4 | 9.0 | — | — |
| Ex. 1-7 | 54 | — | — | — | Copper (II) formate tetrahydrate | 2.0 | 9.0 | — | — |
| Ex. 1-8 | 54 | — | — | — | Copper (II) formate tetrahydrate | 2.0 | 9.0 | — | — |
| Ex. 1-9 | 43 | — | — | — | Copper (II) formate tetrahydrate | 1.1 | 5.0 | — | — |
| Ex. 1-10 | 193 | — | — | — | Copper (II) formate tetrahydrate | 6.8 | 30 | — | — |
| Ex. 1-11 | 107 | — | — | — | Copper (II) formate tetrahydrate | 2.0 | 9.0 | — | — |
| Ex. 1-12 | 48 | — | — | — | Copper (II) formate tetrahydrate | 2.0 | 9.0 | — | — |
| Ex. 1-13 | 39 | — | — | — | Copper (II) formate tetrahydrate | 2.0 | 9.0 | — | — |

TABLE 1-continued

| Example | (mmol) | Component A compound | Mass (g) | (mmol) | Copper compound | Mass (g) | (mmol) | Additive | Amount |
|---|---|---|---|---|---|---|---|---|---|
| Ex. 1-14 | 49 | — | — | — | Copper (II) formate tetrahydrate | 2.0 | 9.0 | — | — |
| Ex. 1-15 | 48 | — | — | — | Copper (II) formate tetrahydrate | 2.0 | 9.0 | — | — |
| Ex. 1-16 | 54 | — | — | — | Copper (II) formate tetrahydrate | 2.0 | 9.0 | Cooper fine particles | 0.20 |
| Ex. 1-17 | 51 | — | — | — | Copper (II) formate tetrahydrate | 2.0 | 9.0 | Methanol | 0.20 |
| Ex. 1-18 | 51 | — | — | — | Copper (II) formate tetrahydrate | 2.0 | 9.0 | Isopropanol | 0.20 |
| Ex. 1-19 | 51 | — | — | — | Copper (II) formate tetrahydrate | 2.0 | 9.0 | Toluene | 0.20 |
| Ex. 1-20 | 51 | — | — | — | Copper (II) formate tetrahydrate | 2.0 | 9.0 | Ethylene glycol | 0.20 |
| Ex. 1-21 | 51 | — | — | — | Copper (II) formate tetrahydrate | 2.0 | 9.0 | Propylene glycol monomethyl ether | 0.20 |
| Ex. 1-22 | 5.4 | Formic acid | 0.083 | 1.8 | — | — | — | SFCP-200A | 0.10 |
| Ex. 1-23 | 34 | — | — | — | Copper (II) formate tetrahydrate | 2.3 | 10.0 | SFCP-200A | 0.65 |
| Ex. 1-24 | 48 | — | — | — | Copper (II) formate tetrahydrate | 3.4 | 15.0 | SFCP-200A | 0.48 |
| Ex. 1-25 | 48 | — | — | — | Copper (II) formate tetrahydrate | 3.4 | 15.0 | SFCP-200A | 1.44 |
| Ex. 1-26 | 48 | — | — | — | Copper (II) formate tetrahydrate | 3.4 | 15.0 | SFCP-10AX | 1.44 |
| Ex. 1-27 | 48 | — | — | — | Copper (II) formate tetrahydrate | 3.4 | 15.0 | SFCP-500A | 1.44 |
| Ex. 1-28 | 48 | — | — | — | Copper (II) formate tetrahydrate | 3.4 | 15.0 | SFCP-200A | 2.87 |
| Ex. 1-29 | 48 | — | — | — | Copper (II) formate tetrahydrate | 3.4 | 15.0 | SFCP-200A | 9.57 |
| Ex. 1-30 | 48 | — | — | — | Copper (II) formate tetrahydrate | 3.4 | 15.0 | SFCP-10AX / SFCP-200A | 0.72 / 0.72 |

Comparative Examples 1-1 to 1-6

Preparation of Composition for Copper Patterning

Compositions for copper patterning were prepared at the compositional ratios shown in Table 2.

TABLE 2

| | Component A: Copper β-ketocarboxylate compound | | | Component B: Amine compound (g) | | | | | | |
|---|---|---|---|---|---|---|---|---|---|---|
| | Compound used | Mass (g) | In mole (mmol) | 2-Ethylhexyl amine (b.p. 168° C.) | n-Butyl amine (b.p. 77° C.) | n-Hexyl amine (b.p. 130° C.) | Isoamyl amine (b.p. 97° C.) | 3-Ethoxypropyl amine (b.p. 132° C.) | 3-Amino-1,2-propane diol (b.p. >250° C.) | In mole (mmol) |
| Comp. Ex. 1-1 | — | — | — | 2.5 | 2.5 | — | — | — | — | 54 |
| Comp. Ex. 1-2 | Copper acetoacetate dihydrate | 0.030 | 0.10 | 2.5 | 2.5 | — | — | — | — | 54 |
| Comp. Ex. 1-3 | Copper acetoacetate dihydrate | 0.30 | 1.0 | 0.25 | 0.25 | — | — | — | — | 5.4 |

TABLE 2-continued

| | | | | | | | | | | |
|---|---|---|---|---|---|---|---|---|---|---|
| Comp. Ex. 1-4 | Copper acetoacetate dihydrate | 0.30 | 1.0 | 0.25 | 0.25 | — | — | — | — | 5.4 |
| Comp. Ex. 1-5 | Copper acetoacetate dihydrate | 0.30 | 1.0 | 2.5 | 2.5 | — | — | — | — | 54 |
| Comp. Ex. 1-6 | Copper acetoacetate dihydrate | 0.30 | 1.0 | — | — | — | — | — | 5.0 | 55 |

| | Component C-1: Organic acid | | | Component C-2: Organic Copper compound | | | Other component | |
|---|---|---|---|---|---|---|---|---|
| | Compound used | Mass (g) | In mole (mmol) | Compound used | Mass (g) | In mole (mmol) | Compound used | Mass (g) |
| Comp. Ex. 1-1 | — | — | — | Copper (II) formate tetrahydrate | 2.3 | 9.0 | — | — |
| Comp. Ex. 1-2 | — | — | — | Copper (II) formate tetrahydrate | 2.3 | 9.0 | — | — |
| Comp. Ex. 1-3 | — | — | — | — | — | — | — | — |
| Comp. Ex. 1-4 | — | — | — | — | — | — | Acetic acid | 0.080 |
| Comp. Ex. 1-5 | — | — | — | — | — | — | Copper (II) acetate | 2.3 |
| Comp. Ex. 1-6 | — | — | — | Copper (II) formate tetrahydrate | 2.3 | 9.0 | — | — |

Examples 2-1 to 2-35

Production of Copper Pattern

Under the conditions shown in Table 3, each of the compositions prepared in Examples 1-1 to 1-30 was applied with a bar coater to a substrate of various kinds (slide glass (referred to as glass hereinbelow), polyimide (abbreviated as PI hereinbelow), polyethylene naphthalate (abbreviated as PEN hereinbelow), or polyethylene terephthalate (abbreviated as PET hereinbelow) to prepare a film of 30 mm×50 mm. Next, the films were sintered at the sintering temperatures in the atmospheres shown in Table 3 in a heating furnace (SMT-SCOPE manufactured by SANYO SEIKO KABUSHIKI KAISHA) for 20 minutes to obtain copper patterns (solid films) having a film thickness of 1 μm. The nitrogen atmosphere was established by flowing nitrogen gas at a flow rate of 1 L/min in the heating furnace.

Each of the copper patterns was evaluated for volume resistivity and shrinkage. The results are shown in Table 3. The volume resistivity was measured with a four-point probe method (trade name "LORESTA GP" manufactured by MITSUBISHI CHEMICAL CORPORATION). The shrinkage was evaluated with respect to the area of the film of the composition for copper patterning, and the films of which shrinkage in area after sintering was not higher than 5% were indicated as "GOOD", and those of higher than 5% as "BAD", with the measured values in parenthesis.

TABLE 3

| | Composition for copper patterning | Substrate | Sintering Conditions | | Volume resistivity (μΩ·cm) | Evaluation of shrinkage (shrinkage %) |
|---|---|---|---|---|---|---|
| | | | Temperature (°C.) | Atmosphere | | |
| Example 2-1 | Example 1-1 | PEN | 150 | Nitrogen | 25.4 | GOOD (1) |
| Example 2-2 | Example 1-2 | Glass | 250 | Nitrogen | 59.1 | GOOD (0) |
| Example 2-3 | Example 1-3 | Glass | 250 | Nitrogen | 45.5 | GOOD (0) |
| Example 2-4 | Example 1-4 | Glass | 250 | Nitrogen | 71.4 | GOOD (0) |
| Example 2-5 | Example 1-5 | Glass | 250 | Nitrogen | 4.7 | GOOD (0) |
| Example 2-6 | Example 1-5 | PI | 200 | Nitrogen | 5.5 | GOOD (0) |
| Example 2-7 | Example 1-5 | PEN | 150 | Nitrogen | 12.5 | GOOD (0) |
| Example 2-8 | Example 1-5 | PET | 130 | Nitrogen | 23.3 | GOOD (0) |
| Example 2-9 | Example 1-6 | PEN | 150 | Nitrogen | 10.1 | GOOD (0) |
| Example 2-10 | Example 1-7 | PEN | 150 | Nitrogen | 13.3 | GOOD (2) |
| Example 2-11 | Example 1-8 | PEN | 150 | Nitrogen | 11.9 | GOOD (1) |
| Example 2-12 | Example 1-9 | PEN | 150 | Nitrogen | 35.1 | GOOD (0) |
| Example 2-13 | Example 1-10 | PEN | 150 | Nitrogen | 10.1 | GOOD (4) |
| Example 2-14 | Example 1-11 | PEN | 150 | Nitrogen | 20.2 | GOOD (4) |

TABLE 3-continued

|  | Composition for copper patterning | Substrate | Sintering Conditions Temperature (° C.) | Atmosphere | Volume resistivity ($\mu\Omega \cdot cm$) | Evaluation of shrinkage (shrinkage %) |
|---|---|---|---|---|---|---|
| Example 2-15 | Example 1-12 | PEN | 150 | Nitrogen | 19.3 | GOOD (1) |
| Example 2-16 | Example 1-13 | PEN | 150 | Nitrogen | 17.4 | GOOD (2) |
| Example 2-17 | Example 1-14 | PEN | 150 | Nitrogen | 19.6 | GOOD (4) |
| Example 2-18 | Example 1-15 | PEN | 150 | Nitrogen | 22.7 | GOOD (1) |
| Example 2-19 | Example 1-16 | PEN | 150 | Nitrogen | 10.5 | GOOD (0) |
| Example 2-20 | Example 1-17 | PEN | 150 | Nitrogen | 13.9 | GOOD (2) |
| Example 2-21 | Example 1-18 | PEN | 150 | Nitrogen | 14.1 | GOOD (3) |
| Example 2-22 | Example 1-19 | PEN | 150 | Nitrogen | 19.6 | GOOD (3) |
| Example 2-23 | Example 1-20 | PEN | 150 | Nitrogen | 11.5 | GOOD (4) |
| Example 2-24 | Example 1-21 | PEN | 150 | Nitrogen | 13.9 | GOOD (3) |
| Example 2-25 | Example 1-22 | PI | 200 | Nitrogen | 30.8 | GOOD (0) |
| Example 2-26 | Example 1-23 | PI | 200 | Nitrogen | 9.8 | GOOD (0) |
| Example 2-27 | Example 1-24 | PI | 200 | Nitrogen | 7.7 | GOOD (0) |
| Example 2-28 | Example 1-25 | PI | 200 | Nitrogen | 8.1 | GOOD (0) |
| Example 2-29 | Example 1-25 | Glass | 200 | Nitrogen | 8.5 | GOOD (0) |
| Example 2-30 | Example 1-25 | PEN | 150 | Nitrogen | 20.6 | GOOD (0) |
| Example 2-31 | Example 1-26 | PI | 200 | Nitrogen | 9.6 | GOOD (0) |
| Example 2-32 | Example 1-27 | PI | 200 | Nitrogen | 8.4 | GOOD (0) |
| Example 2-33 | Example 1-28 | PI | 200 | Nitrogen | 51.2 | GOOD (0) |
| Example 2-34 | Example 1-29 | PI | 200 | Nitrogen | 802.4 | GOOD (0) |
| Example 2-35 | Example 1-30 | PI | 200 | Nitrogen | 7.3 | GOOD (0) |

From Table 3, it is seen that the copper patterns obtained by the methods of Examples 2-1 to 2-24 had volume resistivities of 4.7 to 59.1 $\mu\Omega \cdot cm$, and may be used as conductive bodies. Further, these copper patterns exhibited little shrinkage after sintering, and thus may be formed into desired shapes by various printing processes.

It is also seen that the copper patterns obtained in Examples 2-25 to 2-35 from the compositions for copper patterning containing copper fine particles had volume resistivities of 7.3 to 802.4 $\mu\Omega \cdot cm$ and may thus be used as conductive bodies, and exhibited little shrinkage after sintering and thus may be formed into desired shapes by various printing processes.

Comparative Examples 2-1 to 2-8

Production of Copper Pattern

Copper patterns (solid films) were produced using the compositions prepared in Examples 1-5 and Comparative Examples 1-1 to 1-6 under the conditions shown in Table 4 in the same way as in Example 2.

The evaluations of the volume resistivity and shrinkage were carried out in the same way as in Example 2. The results are shown in Table 4. The copper patterns which had high volume resistivities of $1\times10^8$ $\mu\Omega \cdot cm$ or higher and could not be used as conductive bodies were not evaluated for shrinkage.

TABLE 4

|  | Composition for copper patterning | Substrate | Sintering conditions Temperature (° C.) | Atmosphere | Volume resistivity ($\mu\Omega \cdot cm$) | Evaluation of shrinkage (shrinkage %) |
|---|---|---|---|---|---|---|
| Comp. Ex. 2-1 | Comp.Ex. 1-1 | PEN | 150 | Nitrogen | 10.9 | BAD (>50) |
| Comp. Ex. 2-2 | Comp.Ex. 1-2 | PEN | 150 | Nitrogen | 12.5 | BAD (>50) |
| Comp. Ex. 2-3 | Comp.Ex. 1-3 | PEN | 150 | Nitrogen | >$10^8$ | — |
| Comp. Ex. 2-4 | Comp.Ex. 1-4 | PEN | 150 | Nitrogen | >$10^8$ | — |
| Comp. Ex. 2-5 | Comp.Ex. 1-5 | PEN | 150 | Nitrogen | >$10^8$ | — |
| Comp. Ex. 2-6 | Comp.Ex. 1-6 | PEN | 150 | Nitrogen | >$10^8$ | — |
| Comp. Ex. 2-7 | Ex. 1-5 | PEN | 150 | Air | >$10^8$ | — |
| Comp. Ex. 2-8 | Ex. 1-5 | PEN | 100 | Nitrogen | >$10^8$ | — |

From Table 4, it is seen that the copper patterns obtained in Comparative Examples 2-1 and 2-2 exhibited shrinkage of not less than 5% upon sintering, so that when desired films were formed by printing or the like process, the desired patterns could not be obtained due to shrinkage after sintering. It is also seen that the copper patterns obtained in Comparative Examples 2-3 to 2-8 had high volume resistivities of $1\times10^8$ $\mu\Omega \cdot cm$ or higher, and thus could not be used as conducive bodies.

Example 3

Production of Copper Pattern by Ink Jet Printing

Ink jet printing was carried out using the composition for copper patterning prepared in Example 1-13. As an ink jet printer, DMP-2831 (Dimatix-Fujifilm Ink, USA) was used, and as an ink jet cartridge, DMC-11610 (Dimatix-Fujifilm Ink, USA) was used. A film in a line pattern of 2 mm×20 mm was produced on PI under the ejection conditions of a frequency of 5 kHz, voltage of 18 V, and a cartridge temperature of 60° C., with the distance of 1 mm between the cartridge head and the substrate and the dot spacing of 20 μm. Then the film was sintered at 200° C. for 20 minutes in an nitrogen atmosphere in a heating furnace (SMT-SCOPE manufactured by SANYO SEIKO KABUSHIKI KAISHA) to produce a copper pattern (line pattern). The nitrogen atmosphere was established by flowing nitrogen gas at a flow rate of 1 L/min in the heating furnace.

The volume resistivity of the obtained copper pattern was measured in the same way as in Example 2-1, and found to be 6.5 μΩ·cm. No breaking by shrinkage was observed.

Comparative Example 3

Production of Copper Pattern by Ink Jet Printing

Ink jet printing was carried out in the same way as in Example 3 except that the composition for copper patterning prepared in Example 1-13 was replaced with the composition for copper patterning prepared in Comparative Example 1-1, and the resulting coated film was sintered to obtain a copper pattern (line pattern).

The obtained copper pattern was observed to have breaking due to shrinkage, which made it impossible to measure the volume resistivity.

Examples 4-1 to 4-4

Production of Copper Pattern by Dispenser Printing

Dispenser printing was carried out using each of the compositions for copper patterning prepared in Examples 1-5, 1-24, 1-25, and 1-28. As a dispenser printer, SHOT mini, ML-606GX manufactured by MUSASHI ENGINEERING CO., LTD. was used, with the needle diameter of 0.1 mm and the distance of 0.1 mm between the dispenser head and the substrate, to produce a film in a line pattern of 30 mm long on a PI substrate. The film thickness was controlled by regulating the discharge pressure so that the sintered film thickness was 1 μm. The sintering was carried out at 200° C. for 20 minutes in a nitrogen atmosphere in a heating furnace (SMT-SCOPE manufactured by SANYO SEIKO KABUSHIKI KAISHA) to obtain a copper pattern (line pattern). The nitrogen atmosphere was established by flowing nitrogen gas at a flow rate of 1 L/min in the heating furnace.

The line width of the obtained copper patterns was measured and the results are shown in Table 5.

TABLE 5

|  | Composition for copper patterning | Line width (mm) |
|---|---|---|
| Example 4-1 | Example 1-5 | 2.0 |
| Example 4-2 | Example 1-24 | 1.0 |
| Example 4-3 | Example 1-25 | 0.4 |
| Example 4-4 | Example 1-28 | 0.2 |

From Table 5, it is seen that in Examples 4-2 to 4-4, wherein the copper concentration and the viscosity of the compositions for copper patterning were high due to the addition of copper fine particles, the wetting of the line patterns were inhibited, and the lines could be made thinner even in the production of patterns of the same film thickness. Incidentally, all the copper patterns had volume resistivities on the order of 10 μΩ·cm or lower, and the conductivity was maintained.

What is claimed is:

1. A composition for copper patterning, comprising:
   Component A: a copper β-ketocarboxylate compound represented by the formula (1):

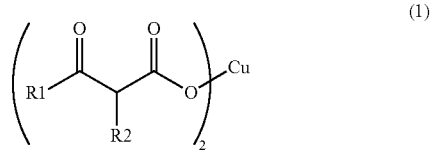

wherein R1 and R2 each independently stands for a hydrogen atom or a C1-C6 straight- or C3-C6 branched-hydrocarbon group, or R1 and R2 are linked with a C2-C4 hydrocarbon group; and based on 1 mol of Component A,
   Component B: an amine compound having a boiling point of not higher than 250° C. in an amount of 0.1 to 500 mol; and
   at least one of:
      Component C-1: an organic acid having pKa of not more than 4 in an amount of 0.01 to 20 mol, and
      Component C-2: an organic copper compound composed of copper and an organic acid having pKa of not more than 4 in an amount of 0.01 to 100 mol.

2. The composition for copper patterning according to claim 1, wherein said Component C-1 is formic acid.

3. The composition for copper patterning according to claim 1, wherein said Component C-2 is copper formate.

4. A method of copper patterning comprising printing with the composition for copper patterning of claim 1 on a substrate, and sintering at 120 to 250° C. in an inert gas atmosphere.

* * * * *